(12) United States Patent
Jeong et al.

(10) Patent No.: US 10,261,616 B2
(45) Date of Patent: Apr. 16, 2019

(54) PRESSURE SENSOR WITH WATERPROOF STRUCTURE AND ELECTRONIC DEVICE INCLUDING THE SAME

(71) Applicant: Samsung Electronics Co., Ltd., Suwon-si, Gyeonggi-do (KR)

(72) Inventors: Jeong Sik Jeong, Hwaseong-si (KR); Han Vit Kang, Suwon-si (KR); Ho Kyung Kang, Daegu (KR); Byeong Cheol Kim, Suwon-si (KR); Jung Won Kim, Hwaseong-si (KR); Kwang Tai Kim, Suwon-si (KR); Hyung Sup Byeon, Suwon-si (KR); Hyun Ju Hong, Osan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 109 days.

(21) Appl. No.: 15/634,255

(22) Filed: Jun. 27, 2017

(65) Prior Publication Data
US 2018/0004333 A1     Jan. 4, 2018

(30) Foreign Application Priority Data

Jun. 29, 2016     (KR) .................... 10-2016-0081622

(51) Int. Cl.
| | |
|---|---|
| *H05K 1/18* | (2006.01) |
| *H05K 5/00* | (2006.01) |
| *H05K 5/02* | (2006.01) |
| *G06F 3/041* | (2006.01) |
| *G06F 3/044* | (2006.01) |

(Continued)

(52) U.S. Cl.
CPC ............ *G06F 3/0414* (2013.01); *G06F 3/044* (2013.01); *H01L 27/323* (2013.01); *H01L 51/524* (2013.01); *H05K 1/189* (2013.01); *H05K 5/0017* (2013.01); *H05K 5/0213* (2013.01); *H01L 27/3225* (2013.01); *H01L 27/3244* (2013.01);

(Continued)

(58) Field of Classification Search
None
See application file for complete search history.

(56) References Cited

U.S. PATENT DOCUMENTS

| | | | |
|---|---|---|---|
| 5,942,733 | A | 8/1999 | Allen et al. |
| 7,609,178 | B2 | 10/2009 | Son et al. |

(Continued)

FOREIGN PATENT DOCUMENTS

KR     10-2015-0129431 A     11/2015

*Primary Examiner* — Ifedayo B Iluyomade
(74) *Attorney, Agent, or Firm* — Jefferson IP Law, LLP

(57) ABSTRACT

An electronic device is provided. The electronic device includes a housing including at least one opened surface, a touchscreen display at least a portion of which is exposed through the opened surface of the housing, and a pressure sensor disposed between the touchscreen display and the housing. The pressure sensor includes a first electrode plate having a first size and a first shape, a second electrode plate having a size and a shape that are the same as or similar to the first size and the first shape and facing the first electrode plate, a dielectric layer disposed in a first area between the first electrode plate and the second electrode plate, and a waterproof member disposed in a second area corresponding to a peripheral area of the first area and at least partially enclosing a space between the first electrode plate and the second electrode plate.

20 Claims, 13 Drawing Sheets

(51) Int. Cl.
    *H01L 27/32*     (2006.01)
    *H01L 51/52*     (2006.01)

(52) U.S. Cl.
    CPC ............... *H05K 2201/056* (2013.01); *H05K 2201/10128* (2013.01); *H05K 2201/10151* (2013.01)

(56) References Cited

U.S. PATENT DOCUMENTS

| | | |
|---|---|---|
| 2007/0257821 A1 | 11/2007 | Son et al. |
| 2017/0063421 A1* | 3/2017 | Moon .................. H04B 1/3888 |
| 2017/0285815 A1* | 10/2017 | Yamazaki ............. G06F 3/0412 |

* cited by examiner

PRESSURE SENSOR WITH WATERPROOF STRUCTURE AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Jun. 29, 2016 in the Korean Intellectual Property Office and assigned Serial number 10-2016-0081622, the entire disclosure of which is hereby incorporated by reference.

TECHNICAL FIELD

The present disclosure relates to a pressure sensor and an electronic device including the same.

BACKGROUND

Electronic devices, which have been recently suggested, employ a touchscreen display in which a touch pane and a display device are integrated. Such an electronic device may receive a user input, such as a touch, a drag, or a flick, based on the touchscreen display and may output a related event.

The electronic device may detect the user input in various forms, and an example of the forms may include a method of utilizing a pressure based on a user input. The electronic device may employ a pressure sensor to detect a pressure applied from the outside, and may output an event corresponding to the detected pressure. The pressure sensor may be largely classified into a capacitive type and a resistive film type. Among them, the pressure sensor of a capacitive type may be applied to various fields due to excellent durability, temperature characteristics, or sensitivity thereof.

The capacitive pressure sensor may detect a pressure based on a change of capacitance between two facing electrode plates. The calculation of the capacitance may be related to the areas and the distance of the two electrode plates, and the dielectric constant of the dielectric disposed between the two electrode plates. The dielectric constant may be a fixed value based on the characteristics of the material realized as the dielectric (or included in the dielectric). However, when the physical characteristics of the dielectric are changed by an external influence, the dielectric constant may be changed, causing a malfunction of the pressure sensor.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a pressure sensor with a waterproof structure that may stably maintain physical characteristics of a dielectric and an electronic device including the same.

In accordance with an aspect of the present disclosure, an electronic device is provided. The electronic device includes a housing including at least one opened surface, a touchscreen display disposed in an interior space of the housing and at least a portion of which is exposed through the opened surface of the housing, a pressure sensor disposed between the touchscreen display and the housing and configured to detect an external pressure applied to the touchscreen display, and at least one processor electrically connected to the pressure sensor.

In accordance with another aspect of the present disclosure, the pressure sensor is provided. The pressure sensor includes a first electrode plate disposed in parallel to the touchscreen display and having a first size and a first shape, a second electrode plate having a size and a shape that are the same as or similar to the first size and the first shape and facing the first electrode plate, a dielectric layer disposed in a first area between the first electrode plate and the second electrode plate, and a waterproof member disposed in a second area corresponding to a peripheral area of the first area and at least partially closing a space between a lower surface of the first electrode plate and an upper surface of the second electrode plate.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
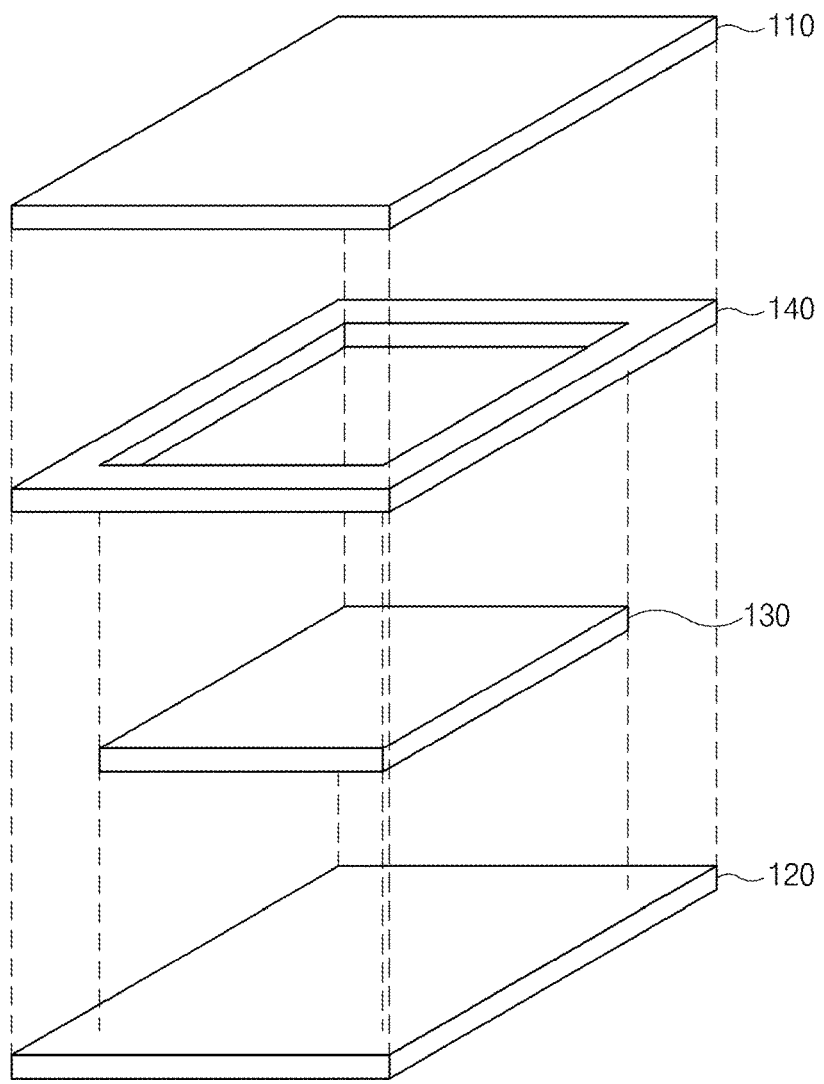
FIG. 1A is an exploded perspective view illustrating a pressure sensor with a waterproof structure including a waterproof member of a first size according to an embodiment of the present disclosure.

Hereinafter, various embodiments of the present disclosure are disclosed with reference to the accompanying drawings. However, the present disclosure is not intended to be limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

Figure 1B:
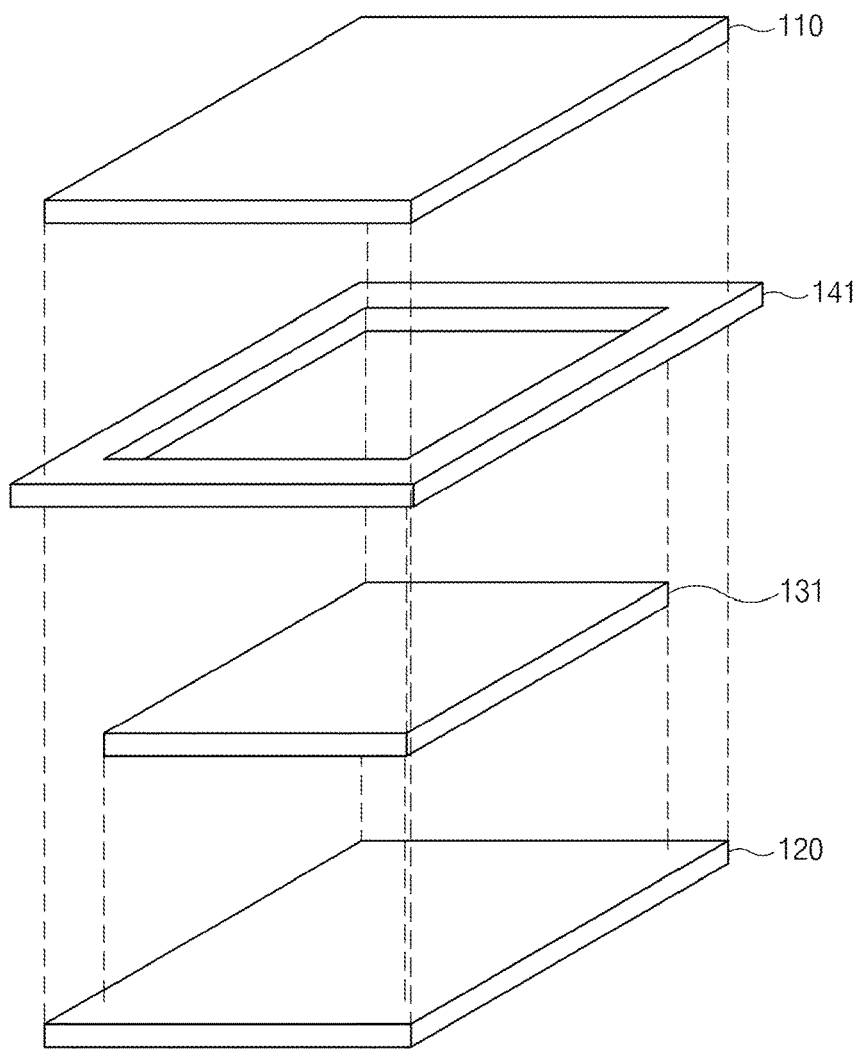
FIG. 1B is an exploded perspective view illustrating a pressure sensor with a waterproof structure including a waterproof member of a second size according to an embodiment of the present disclosure.
Figure 1C:
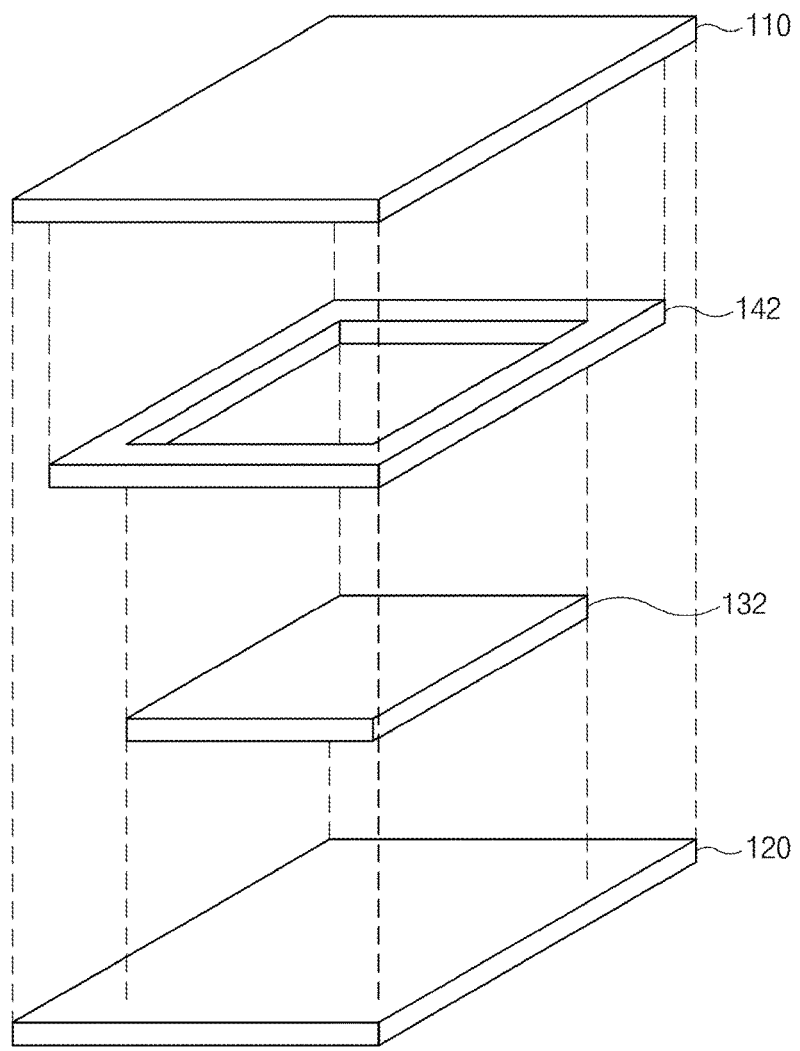
FIG. 1C is an exploded perspective view illustrating a pressure sensor with a waterproof structure including a waterproof member of a third size according to an embodiment of the present disclosure.

FIGS. 1A, 1B, and 1C are exploded perspective views illustrating a pressure sensor with a waterproof structure including waterproof members having first to third sizes according to various embodiments of the present disclosure.

Referring to FIGS. 1A to 1C, the pressure sensor 100 with a waterproof structure may include a first electrode plate 110, a second electrode plate 120, a dielectric layer 130, 131, or 132, and a waterproof member 140, 141, or 142.

The pressure sensor 100 with a waterproof structure according to an embodiment may detect a pressure applied from the outside based on a change of the capacitance between the first electrode plate 110 and the second electrode plate 120, which face each other. For example, an external pressure (e.g., a pressure of a specific value or more by the body of a user or a touch pen) is applied to the first electrode plate 110 or the second electrode plate 120, an external shape of the first electrode plate 110 or the second electrode plate 120 may be deformed (at least a portion of the first electrode plate 110 or the second electrode 120 is curved concavely). In this case, a distance between the first electrode plate 110 and the second electrode plate 120 may be changed.

Equation 1 may be an equation related to calculation of capacitance.

$$C = \varepsilon \frac{A}{d}$$ Equation 1

C: Capacitance between first electrode plate 110 and second electrode plate 120

A: Area of first electrode plate 110 or second electrode plate 120 d: Distance between first electrode plate 110 and second electrode plate 120

ε: Dielectric constant of dielectric layers 130 to 132

Based on Equation 1, a change of the distance d between the first electrode plate 110 and the second electrode plate 120 may be related to the change of the capacitance C between the first electrode plate 110 and the second electrode plate 120. If the dielectric constant is not changed, the capacitance C may increase as the distance between the first electrode plate 110 and the second electrode plate 120 is shortened.

According to an embodiment, the pressure sensor 100 with a waterproof structure may detect an external pressure applied to the first electrode plate 100 or the second electrode plate 120 by detecting the change of the capacitance C through a circuit (e.g., a pressure sensor integrated circuit (IC) (105 of FIG. 9) which will be described below).

According to an embodiment, the first electrode plate 110 and the electrode plate 120 may have corresponding shapes. For example, if the first electrode plate 110 has a first size and a first shape, the second electrode plate 110 may have a size and a shape that are the same as or similar to the first size and the first shape of the first electrode plate 110. Further, the areas of the first electrode plate 110 and the second electrode plate 120 may be the same or similar According to various embodiments, the pressure sensor 100 with a waterproof structure may detect a change of capacitance related to sensing of a pressure even though the first electrode plate 110 has an area that is larger than that of the second electrode plate 120 or the second electrode plate 120 has an area that is larger than that of the first electrode plate 110.

According to an embodiment, the first electrode plate 110 and the second electrode plate 120 may be stacked to be spaced apart from each other at a specific interval. The first electrode plate 110 and the second electrode plate 120 having the same or similar areas may be vertically aligned with each other without having any protruding portion.

In an embodiment, at least one of the first electrode plate 110 and the second electrode plate 120 may include a printed circuit board (or an insulation board) and a conductive pattern formed in the printed circuit board. For example, at least one of the first electrode plate 110 and the second electrode plate 120 may be realized by a printed circuit board having a conductive pattern on an upper or lower surface thereof. The conductive pattern may include various electrode arrangements, and for example, may include an arrangement in which at least one polygonal electrodes are regularly repeated or an arrangement in which at least one electrode extends towards a specific direction. Further, at least a portion of at least one of the first electrode plate 110 and the second electrode plate 120 may include a conductive metallic material (e.g., copper, magnesium, silver, or titanium).

In this regard, any one of the first electrode plate 110 and the second electrode plate 120 may be realized by a metal plate including the metallic material, and the other one of the first electrode plate 110 and the second electrode plate 120 may be realized by a printed circuit board including a conductive pattern having a regularly repeated electrode arrangement (e.g, a self-capacitance type). Further, any one of the first electrode plate 110 and the second electrode plate 120 may be realized by a printed circuit board including a conductive pattern having an electrode arrangement extending in a first direction, and the other one of the first electrode plate 110 and the second electrode plate 120 may be realized by a printed circuit board including a conductive pattern having an electrode arrangement extending in a second direction (e.g., a direction that is perpendicular to the first direction) (e.g., a mutual capacitance type). In an embodiment, at least one of the first electrode plate 110 and the second electrode plate 120 may include a transparent conductive film (e.g., indium tin oxide (ITO) or indium zinc oxide (IZO)), a silver nanowire, a metal mesh, or a carbon allotrope (e.g., graphene).

According to an embodiment, any one of the first electrode plate 110 and the second electrode plate 120 may have a flexible property of a specific value such that the shape thereof may be deformed in correspondence to a pressure applied from the outside, and the other one of the first electrode plate 110 and the second electrode plate 120 may have a fixed property. For example, when the electrode plate, to which a pressure is applied from the outside, is realized by a printed circuit board including a specific conductive pattern, at least one of the printed circuit board may include a flexible printed circuit board (FPCB) of a flexible material.

According to an embodiment, a dielectric layer 130, 131, or 132 may be disposed in a first area between the first electrode plate 110 and the second electrode plate 120. The first area, for example, may include an area (e.g., an area that is inside an area defined in relation to disposition of the waterproof member 140, 141, or 142, which will be described below) except for an area (e.g., a peripheral area between the first electrode plate 110 and the second electrode plate 120) related to the disposition of the waterproof member 140, 141, or 142, among the area between the first electrode plate 110 and the second electrode plate 120. The size of the first area may be changed according to the size of the dielectric layer 130, 131, or 132, or the disposition form of the waterproof member 140, 141, or 142.

According to an embodiment, the dielectric layer 130, 131, or 132 may include at least one material having a unique dielectric constant. For example, the dielectric layer 130, 131, or 132 may include at least one compound (e.g., silicon, a polymer, rubber, sponge, or urethane) Further, the dielectric layer 130, 131, or 132 may be realized by an air layer. At least a partial area of the dielectric layer 130, 131, or 132 may include at least one spacer (e.g., silicon) (not illustrated) supporting the first electrode plate 110 and the second electrode plate 120 to uniformly maintain a spacing interval between the first electrode plate 110 and the second electrode plate 120.

According to an embodiment, the dielectric constant of the dielectric layer 130, 131, or 132 may have a value that is initially (e.g., when the sensor is manufactured) fixed based on a material included in the dielectric layer 130, 131, or 132 (or realized by the dielectric layer 130, 131, or 132). However, when a liquid (e.g., water droplets) is introduced into the dielectric layer 130, 131, or 132, the dielectric constant of the dielectric layer 130, 131, or 132 may change to a value that is different from an initial fixed value. The change of the dielectric constant may influence calculation of the capacitance between the first electrode plate 110 and the second electrode plate 120, deteriorating the performance of the pressure sensor. In this regard, the waterproof member 140, 141, or 142 according to an embodiment may be disposed to interrupt introduction of a liquid into the dielectric layer 130, 131, or 132 to prevent a change of the dielectric constant and stably maintain the pressure detection performance of the pressure sensor.

According to an embodiment, the waterproof member 140, 141, or 142 may be disposed in a second area corresponding to a peripheral area (or an edge area) of the first area (an area in which the dielectric layer 130, 131, or 132 is disposed). The second area, for example, may include an area from an outside (or an outskirt) of the first area to a point on outer surfaces of the first electrode plate 110 and the second electrode plate 120. In this regard, referring to FIG. 1A, when the first area (or the dielectric layer 130) has a first size (e.g., a specific reference size), an outside of the second area (or the waterproof member 140) corresponding to the peripheral area of the first area may be aligned to be vertically (or longitudinally) parallel to the outer surfaces of the first electrode plate 110 and the second electrode plate 120.

According to another embodiment, the second area may include an area from an outside of the first area to a point that extends the outer surfaces of the first electrode plate 110 and the second electrode plate 120 by a specific width. Based on this, referring to FIG. 1B, when the first area (or the dielectric layer 131) has a second size (e.g., a size that is larger than the first size), the outside of the second area (or the waterproof member 141) may protrude by a specific width with respect to the outer surfaces of the first electrode plate 110 and the second electrode plate 120.

Further, as illustrated in FIG. 1C, the second area (or the waterproof member 142) according to another embodiment may include an area from an outside of the first area (or the dielectric layer 132) to a point that does not reach (or is recessed from) the outer surfaces of the first electrode plate 110 and the second electrode plate 120 by a specific width. In this case, the first area may be realized by a third size (e.g., a size that is smaller than the first size).

Figure 2A:
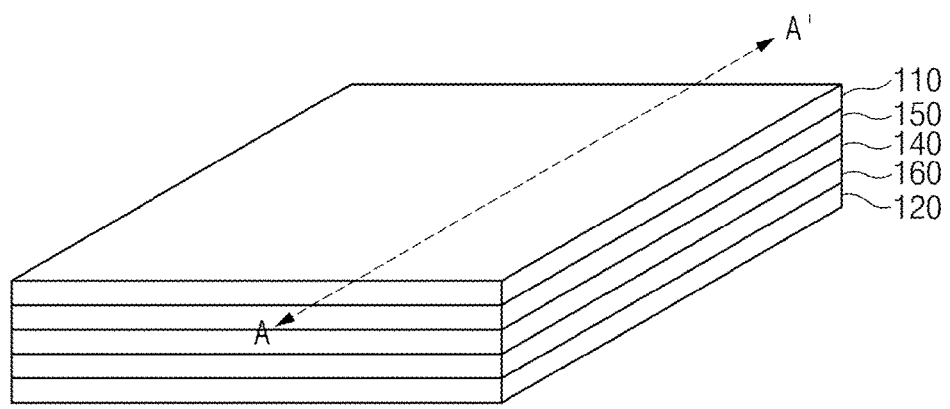
FIG. 2A is a perspective view illustrating a pressure sensor with a waterproof structure according to an embodiment of the present disclosure.
Figure 2B:
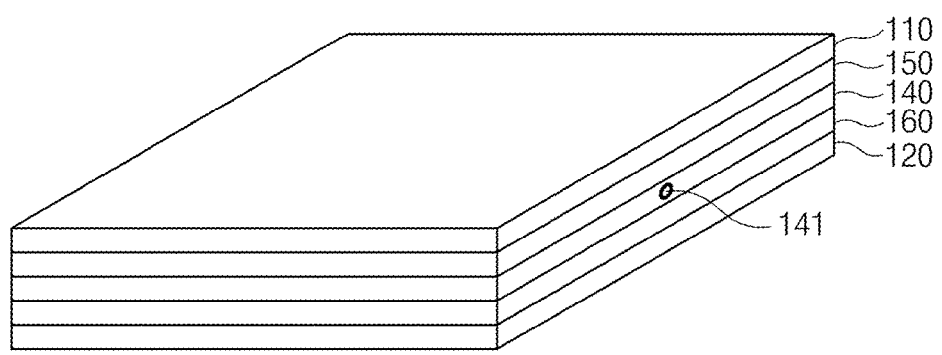
FIG. 2B is a perspective view illustrating a pressure sensor with a waterproof structure including a waterproof member having a hole according to an embodiment of the present disclosure.
Figure 2C:
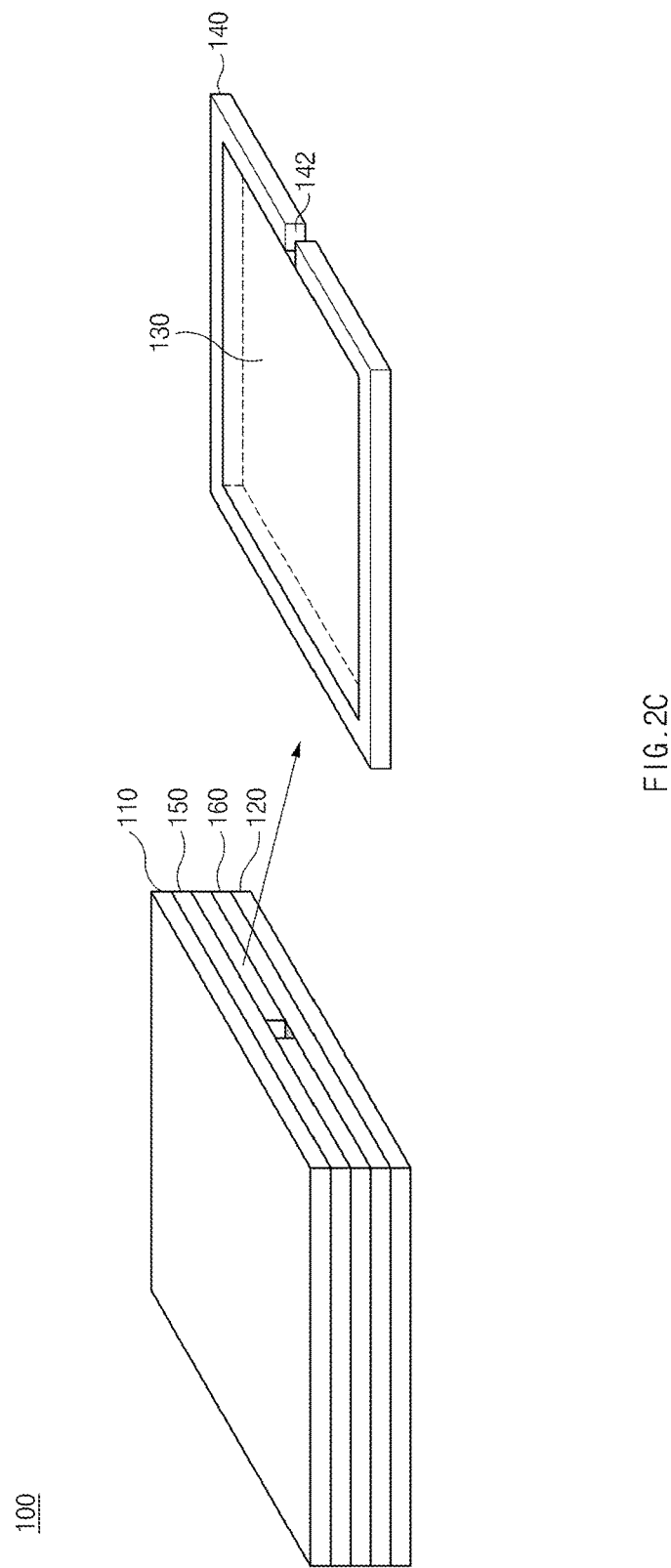
FIG. 2C is a perspective view illustrating a pressure sensor with a waterproof structure including a waterproof member having an aperture according to an embodiment of the present disclosure.

FIGS. 2A, 2B, and 2C are perspective views illustrating a coupled state of a pressure sensor with a waterproof structure including waterproof members having first to third shapes according to various embodiments of the present disclosure.

Hereinafter, an embodiment in which the outside of the waterproof member 140 (or the second area) is vertically aligned with the outer surfaces of the first electrode plate 110 and the second electrode plate 120 (or the outskirt of the waterproof member 140 vertically coincides with the outskirts of the first electrode plate 110 and the second electrode plate 120) will be described as an example. However, the following description may be applied to an embodiment in which the outside of the waterproof 140 protrudes or is recessed by a specific width with respect to the outer surfaces of the first electrode plate 110 and the second electrode plate 120 in the same or similar ways.

Referring to FIGS. 2A to 2C, the first electrode plate 110 and the second electrode plate 120 may be stacked, and the waterproof member 140 may be disposed between the first electrode plate 110 and the second electrode plate 120. For example, the waterproof member 140 may be disposed in the above-mentioned second area (e.g., an edge area between the first electrode plate 110 and the second electrode plate 120) to be bonded to a lower surface of the first electrode plate 110 and an upper surface of the second electrode plate 120. Accordingly, the waterproof member 140 may close an area between the first electrode plate 110 and the second electrode plate 120 (or may interrupt exposure of the dielectric layer 130 disposed in the first area between the first electrode plate 110 and the second electrode plate 120). In this regard, a first bonding layer 150 and a second bonding layer 160 may be disposed between the first electrode plate 110 and the waterproof member 140 and between the waterproof member 140 and the second electrode plate 120, respectively, to support bonding of the waterproof member 140, and the first electrode plate 110 and the second electrode plate 120.

In various embodiments, the shapes of the first bonding layer 150 and the second bonding layer 160 may be the same as or similar to the shape of the waterproof member 140. For example, the shape of the first bonding layer 150 may be the same as or similar to the shape of the upper surface of the waterproof member 140, which substantially faces (or is bonded to) the lower surface of the first electrode plate 110. In correspondence, the shape of the second bonding layer 160 may be the same as or similar to the shape of the lower surface of the waterproof member 140, which substantially faces the upper surface of the second electrode plate 120. When at least a portion of the waterproof member 140 protrudes with respect to the outer surfaces of the first electrode plate 110 and the second electrode plate 120, the first bonding layer 150 and the second bonding layer 160 may be excluded from the upper surface and lower surface areas of the protruding waterproof member 140. In various embodiments, the first bonding layer 150 and the second bonding layer 160 may include at least one of bonding materials, such as a ultraviolet (UV) film, a thermosetting adhesive, a laser curing adhesive, an ultrasonic curing adhesive, a non-conductive film (NCF), an anisotropic conductive film (ACF), and a non-conductive paste (NCP).

According to an embodiment, the waterproof member 140 may include a porous structure (e.g., a gore-tex membrane). The porous structure, for example, may include about 9 billion holes per square inches. Further, the porous structure may include at least one polymer (e.g., polytetrafluoroethylene) layer. Due to the porous structure, at least one hole formed on a surface and in the interior of the waterproof member 140 may realize bidirectional ventilations between the outside of the waterproof member 140 and the dielectric layer 130. Due to the ventilation characteristics of the waterproof member 140, the shape of any one of the first electrode plate 110 and the second electrode plate 120 may be deformed (e.g., an area of any one of the first electrode plate 110 and the second electrode plate 120, to which a pressure is applied, may be recessed concavely) according to a pressure applied from the outside.

According to an embodiment, the waterproof member 140 may include a material of flexible or resilient characteristics. In this regard, the flexible or resilient characteristics of the waterproof member 140 may be caused by deformation of the shape of any one of the first electrode plate 110 and the second electrode plate 120. For example, the waterproof member 140 bonded between the first electrode plate 110 and the second electrode plate 120 may correspond to an external pressure due to the flexible or resilient characteristics, and based on this, the shape of the first electrode plate 110 or the second electrode plate 120 may be deformed according to an external pressure applied to the first electrode plate 110 or the second electrode plate 120. Meanwhile, if the external pressure applied to the first electrode plate 110 or the second electrode plate 120 is removed, the waterproof member 140 may be resiliently restored to the circular shape, and based on this, the deformed shape of the first electrode plate 110 or the second electrode plate 120 may be restored.

In various embodiments, the waterproof member 140 may include at least one ventilation assisting unit that assists the above-mentioned ventilation characteristics (or assists ventilations between the outside of the waterproof member 140 and the dielectric layer 130). For example, as illustrated in FIG. 2B, the ventilation assisting unit may be realized by a hole 141 formed on an outer surface of the waterproof member 140. The hole 141 may pass through the outer surface (or inner surface) of the waterproof member 140, starting from the inner surface (or outer surface) of the waterproof member 140, and may be formed on one side of the waterproof member 140 to have a specific size. Referring to FIG. 2C, the ventilation assisting unit, for example, may be realized by a specific aperture 142. The aperture 142 may be formed by isolating one side of the waterproof member 140 and spacing opposite ends of the waterproof member 140 with respect to the isolated point at a specific interval. The ventilation assisting unit (e.g., the hole 141 or the aperture 142) may expose at least a portion of the dielectric layer 130 to assist direct ventilations between the outside of the waterproof member 140 and the dielectric layer 130. The ventilation assisting unit (e.g., the hole 141 or the aperture 142), for example, may have a size that is larger than that of the hole of the porous structure (e.g., the gore-tex membrane) that realizes the waterproof member 140 and smaller than those of water droplets. Meanwhile, the pressure sensor 100 with a waterproof structure according to the present disclosure is not functionally or structurally limited by the above-mentioned ventilation assisting unit, and the ventilation assisting unit may be excluded from the pressure sensor 100 with a waterproof structure according to occasions.

Figure 3:
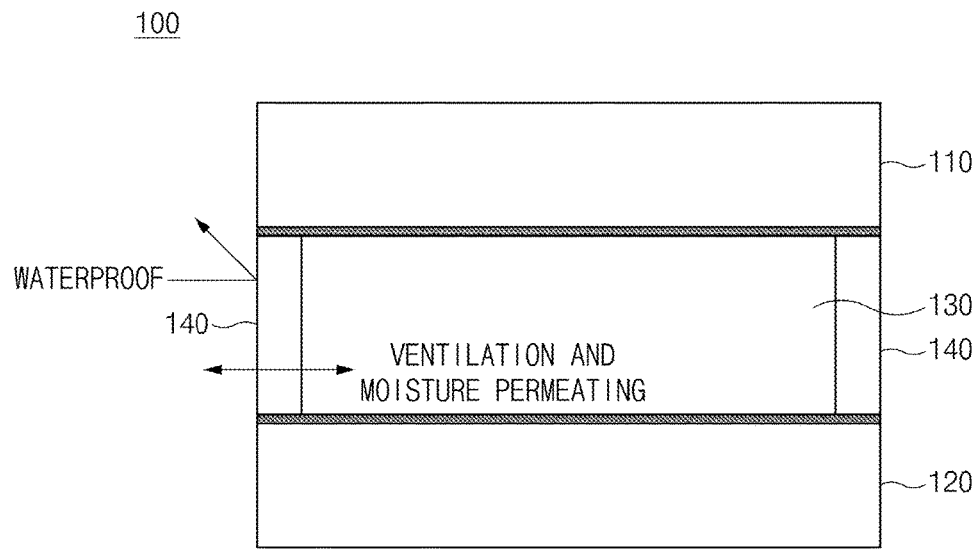
FIG. 3 is a sectional view of the pressure sensor with a waterproof structure according to an embodiment which is taken along line A-A' of FIG. 2A according to an embodiment of the present disclosure.

FIG. 3 is a sectional view of the pressure sensor of FIG. 2A with a waterproof structure, which is taken along line A-A' according to an embodiment of the present disclosure.

Figure 4:
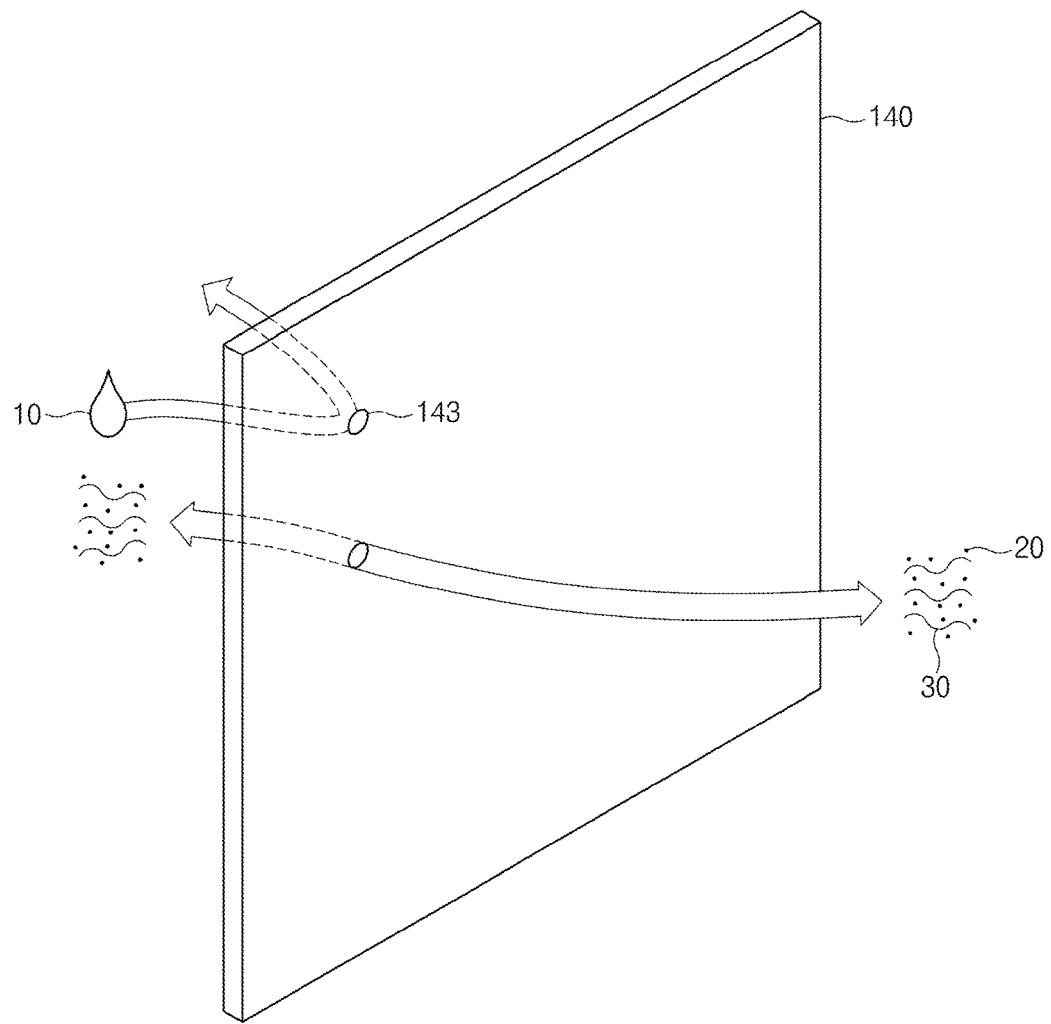
FIG. 4 is a view schematically illustrating characteristics of a waterproof member according to an embodiment of the present disclosure.

FIG. 4 is a view schematically illustrating characteristics of a waterproof member according to an embodiment of the present disclosure.

As described above, the waterproof member 140 according to an embodiment may include a porous structure (e.g., a gore-tex membrane). In this regard, referring to FIGS. 3 and 4, at least one hole constituting the porous structure may have a size that is smaller than those of the water droplets 10 and larger than those of vapor molecules 20. Based on this, the waterproof member 140 may have different characteristics according to directions. For example, as the water droplets 10 are interrupted in the hole 143 formed in the waterproof member 140, the waterproof member 140 may have waterproof characteristics in a direction facing the center of the dielectric layer 130 from the outside. Meanwhile, the humid air 30 including the vapor molecules 20 may pass through the hole 143 formed in the waterproof member 140. Accordingly, the waterproof member 140 may have ventilation and moisture-permeating characteristics, by which the humid air 30 is introduced and discharged in both directions between the outside and the dielectric layer 130. The waterproof, ventilation, and moisture-permeating characteristics of the waterproof member 140 may prevent a change of dielectric characteristics of the dielectric layer 130 by interrupting introduction of a liquid into the dielectric layer 130 and maintaining the content of the vapor 20 of the dielectric layer 130.

Figure 5:
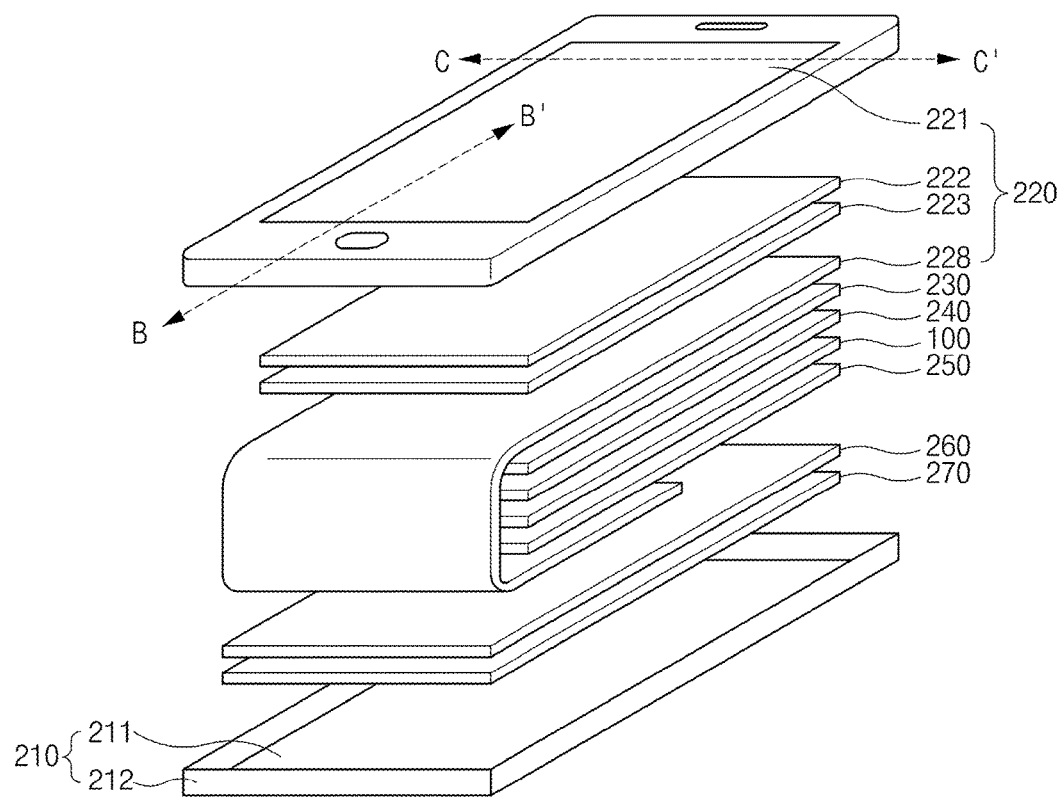
FIG. 5 is a view schematically illustrating an electronic device according to an embodiment of the present disclosure.

FIG. 5 is a view schematically illustrating an electronic device according to an embodiment of the present disclosure.

Referring to FIG. 5, the electronic device 200 according to an embodiment may include a housing 210, a touchscreen display 220, a pressure sensor 100 with a waterproof structure, and at least one processor (not illustrated). In addition, the electronic device 200 may further include an impact absorbing member 230, a digitizer 240, a heating radiating member 250, a support member 260, or a main printed circuit board 270 in relation to performance of functions and a disposition structure of elements. In some embodiments, the electronic device 200 may exclude at least one of the elements or may additionally include another element.

The housing 210 according to an embodiment may include a first surface 211 (e.g., a lower surface of the housing 210) and at least one second surface 212 (e.g., a side surface of the housing 210) that is perpendicular to the first surface. At least one surface (e.g., an upper surface of the housing 210) of the housing 210 may be excluded. Accordingly, at least a portion (e.g., an upper side of the interior space) of an interior space of the housing 210 defined by the first surface 211 and the at least one second surface 212 may be opened.

Although not illustrated, in various embodiments of the present disclosure, the housing 210 may further include a third surface. For example, the third surface may face the first surface 211 of the housing 210, and for example, may be realized by a surface formed by bending an upper end of the second surface 212 (e.g., a side surface of the housing 210) or the excluded surface of the housing 210.

The elements of the electronic device 200 according to an embodiment may be recessed into the interior space of the housing 210 through the opened area (or the excluded upper surface of the housing 210) of the housing 210. An external appearance of the finished electronic device 200 may be realized by disposing the elements of the electronic device 200 in the interior space and coupling the touchscreen display 220 (or the cover glass 221 included in the touchscreen display 220) to the opened area (or the excluded upper surface of the housing 210) of the housing 210.

The touchscreen display 220 according to an embodiment may be disposed between the opened area of the housing 210 and the first surface 211 (e.g., the lower surface of the housing 210). In various embodiments, the touchscreen display 220 may output related content (e.g., a text, an image, a video, an icon, a widget, or a symbol) based on a touch input of a user. In this regard, the touchscreen display 220 may include a cover glass 221, a bonding member 222, a polarizer plate 223, or a display panel 228.

According to an embodiment, at least a portion of the cover glass 221 may be exposed through the opened area of the housing 210, and may transmit light generated by the display panel 228. The user may perform a touch (e.g., force touch) input using a part (e.g., a finger) of the human body or a touch pen on the cover glass 221. In various embodiments, the cover glass 221 may be referenced as a glass window or a cover window.

According to an embodiment, the bonding member 222 may physically bond the cover glass 221 and the polarizer plate 223, and for example, may include at least one of a UV film, an optical adhesive film, a thermosetting adhesive, a laser curing adhesive, an NCF, an ACF, and an NCP.

The polarizer plate 223 according to an embodiment may selectively transmit only light that vibrates in a specific direction, among the light that passed through the cover glass 221, to input the light to the display panel 228. The polarizer plate 223 may include a polarizer (not illustrated) and a protective film (not illustrated) disposed on one surface or opposite surfaces of the polarizer. The protective film may include at least one of a hard coating film, an anti-glare (AG) film, a low reflection (LR) film, an anti-reflection (AR) film, or an AG/LR film and an AG/AR film obtained by compositing the above films.

According to an embodiment, the display panel 228, for example, may include a touch panel (224 of FIG. 6), which will be described below, and may receive a touch using a body of the user or a touch pen, a gesture, a proximity, and a hovering input. Further, the display panel 228 may include an FPCB. The display panel 228, for example, may include a liquid crystal display (LCD), a light emitting diode (LED) display, an organic LED (OLED) display, a microelectromechanical system (MEMS) display, or an electronic paper display.

The impact absorbing member 230 according to an embodiment, for example, may include a cushion member having an embossed structure. The impact absorbing member 230 may be disposed between the touchscreen display 220 and the digitizer 240 to alleviate an external impact applied to the touchscreen display 220, the digitizer 240, or another element.

According to the digitizer 240 according to an embodiment may detect a location of a touch pen (e.g., the digitizer pen) for inputting a signal onto the touchscreen display 220, and may convert the location of the touch pen to a coordinate value to output the coordinate value. In this regard, the digitizer 240 may include a touch pen recognition sensor. In various embodiments, the digitizer 240 may be included as a part of the touch panel (224 of FIG. 6).

The pressure sensor 100 with a waterproof structure according to an embodiment, for example, may be disposed between the touchscreen display 220 and the first surface 211 of the housing 210 to detect an external pressure (e.g., a pressure of a specific value or more by the body of the user or a touch pen) applied to the touchscreen display 220 and may output the detected external pressure as an electrical signal.

The heat radiating member 250 according to an embodiment may absorb heat emitting from an element (e.g., the touchscreen display 220) of the electronic device 200 and radiate the absorbed heat to the outside. The heat radiating member 250 may include at least one metallic material (e.g., copper).

The support member 260 (e.g., a bracket) according to an embodiment may function to fix or support the above-mentioned stack structure of the electronic device 200. The support member 260, for example, may include a plastic injection-molded product or a metallic material.

The main printed circuit board 270 according to an embodiment may include an insulation plate (e.g., phenol or epoxy) and at least one conductive pattern (e.g., copper) formed on the insulation plate. At least one semiconductor chip may be mounted on the main printed circuit board 270.

Figure 6:
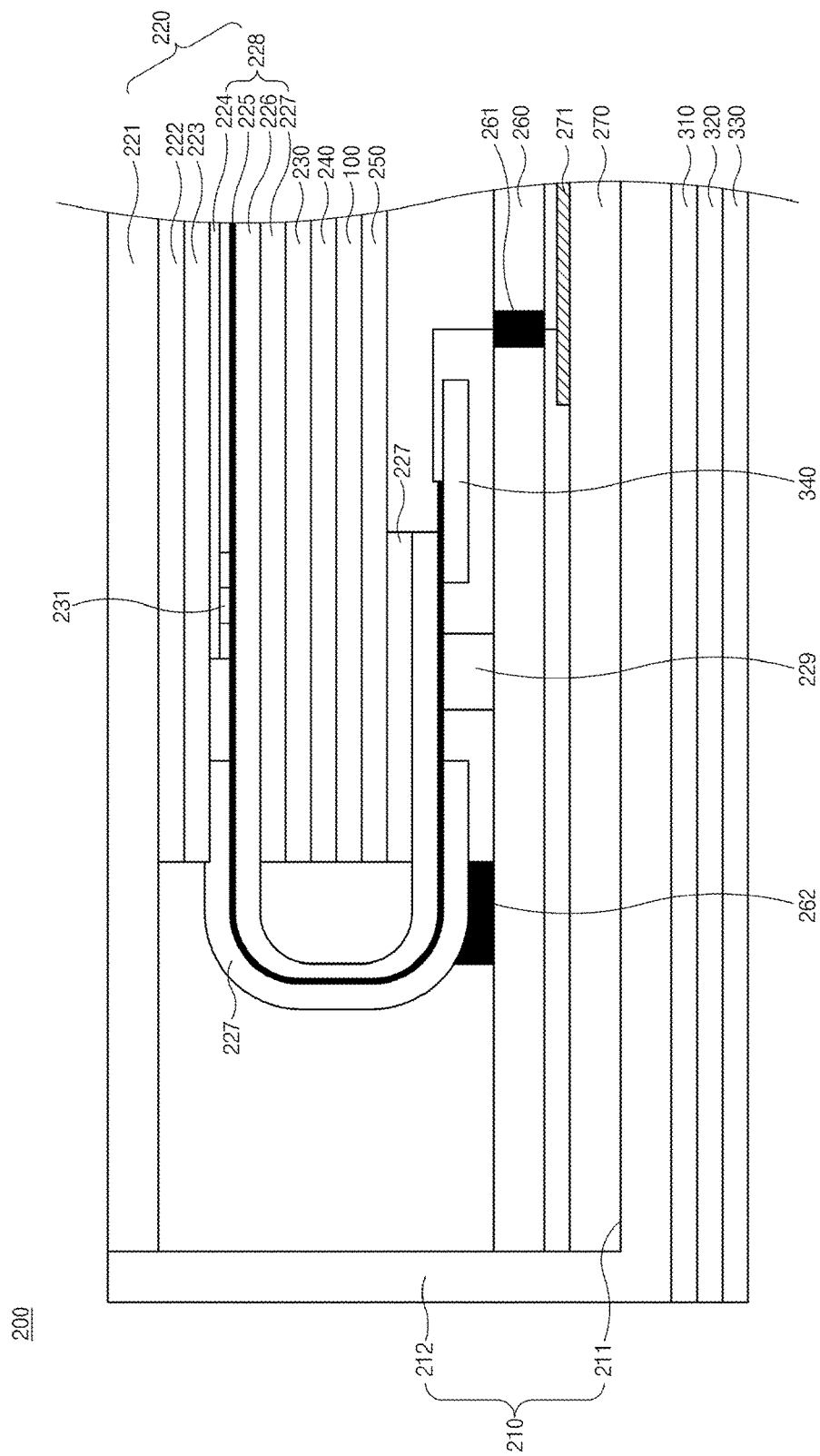
FIG. 6 is a sectional view of the electronic device which is taken along line B-B' of FIG. 5 according to an embodiment of the present disclosure.

FIG. 6 is a sectional view of the electronic device of FIG. 5 which is taken along line B-B' according to an embodiment of the present disclosure.

Figure 7:
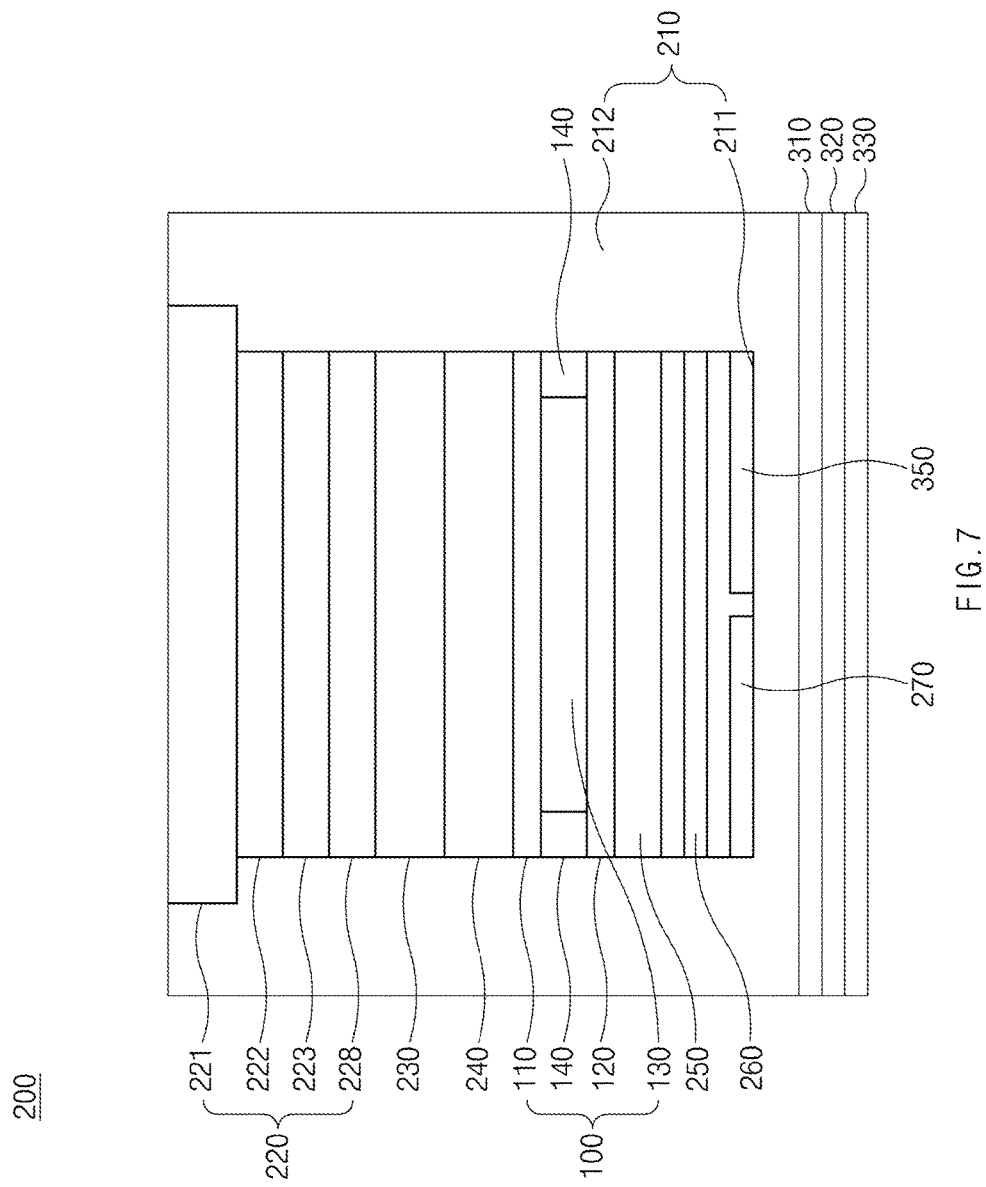
FIG. 7 is a sectional view of the electronic device which is taken along line C-C' of FIG. 5 according to an embodiment of the present disclosure.

FIG. 7 is a sectional view of the electronic device of FIG. 5 which is taken along line C-C" according to an embodiment of the present disclosure.

Referring to FIGS. 6 and 7, the elements that are the same as or correspond to the elements, which have been described above with reference to FIG. 5, may be provided with the same reference numerals and a repeated description thereof may be omitted.

Referring to FIG. 6, the display panel 228 included in the touchscreen display 220 may include a touch panel 224, an organic light emitting layer 231, a wiring line 225 electrically connected to the organic light emitting layer 231, a first polymer layer 226, or a second polymer layer 227.

The touch panel 224 according to an embodiment may detect a physical contact (e.g., a touch by the body of a user or a touch pen) applied to the touchscreen display 220 to output an electrical signal. The touch panel 224, for example, may use at least one of a capacitive type, a resistive type, an infrared type, and an ultrasonic type. Further, the touch panel 224 may include a touch sensor (not illustrated), may be realized by a touch sensor itself, and may further include a control circuit (e.g., a touch sensor IC (224a of FIG. 9)).

The organic light emitting layer 231 according to an embodiment may include a light emitting element (e.g., an OLED element) based on a fluorescent or phosphoric organic compound. Further, the organic light emitting layer 231 may include a switching element (e.g., a switching thin film transistor (TFT)) for individually controlling emission of light of the light emitting element and a driving element (e.g., a driving TFT). In various embodiments, the light emitting element may be realized through a red, green, and blue (RGB)-OLED method in which a plurality of elements of three primary colors are disposed at a specific interval or a white (W)-OLED method that uses elements of emission of white colors. When a W-OLED method is applied to the light emitting element, the organic light emitting layer 231 may include a black matrix or a color filter related to realization of colors of internal light (e.g., white light).

The first polymer layer 226 and the second polymer layer 227 according to an embodiment may be stacked with the wiring line 225 is interposed therebetween and may be folded in a specific direction. An electrode layer may be formed on the first polymer layer 226. In various embodiments, the folding structure formed by the first polymer layer 226 and the second polymer layer 227 may include a multilayered structure further including at least one second polymer layer 227.

The wiring line 225 may be folded together with the first polymer layer 226 and the second polymer layer 227. The wiring line 225 may be extracted from the first polymer layer 226 and the second polymer layer 227 and may be electrically connected to an auxiliary printed circuit board 340. In various embodiments, the wiring line 225 may include at least one of titanium (Ti), copper (Cu), aluminum (Al), molybdenum (Mo), and graphene.

The main printed circuit board 270 according to an embodiment may include at least one semiconductor chip 271. The semiconductor chip 271 may be mounted on the main printed circuit board 270 through a flip chip bonding method. The semiconductor chip 271, for example, may include a system-on-chip (SOC) type application processor (AP) used for smartphones, tablet personal computers (PCs), or navigation devices.

In various embodiments, the electronic device 200 may further include a display driving IC (DDI) 229 and an auxiliary printed circuit board 340. The display driving circuit 229 may control signal processing in relation to driving of the display panel 228. In this regard, the display driving circuit 229 may be electrically connected to the wiring line 225 included in the display panel 228, and may be electrically connected to the main printed circuit board 270 (or the semiconductor chip 271) via the auxiliary printed circuit board 340 as an electrical path.

In various embodiments, a first auxiliary waterproof member 261 or a second auxiliary waterproof member 262 that may assist a function (e.g., a waterproof function) of the pressure sensor 100 with a waterproof structure may be further included in the electronic device 200. For example, the first auxiliary waterproof member 261 may be disposed in a via hole area formed in the support member 260 to electrically connect the auxiliary printed circuit board 340 and the main printed circuit board 270 (or the semiconductor chip 271) to close the via hole. Further, the second auxiliary waterproof member 262 may be disposed in a spacing space between the folded first polymer layer 226 and second polymer layer 227 and the support member 260 to close the spacing space.

In an embodiment, the first auxiliary waterproof member 261 or the second auxiliary waterproof member 262 may close a path, along which the elements (e.g., the pressure sensor 100 with a waterproof structure, the display driving circuit 229, and the auxiliary printed circuit board 340) of the electronic device may be exposed to the outside to interrupt introduction of a liquid or foreign substance to the elements. The first auxiliary waterproof member 261 or the second auxiliary waterproof member 262 may have characteristics (e.g., waterproof, ventilation, and moisture-permeating characteristics in a specific direction) that are the same as or similar to those of the waterproof member 140 described with reference to FIGS. 1A to 1C, 2A to 2C, 3, and 4.

In various embodiments, a separate printed circuit layer 310, a separate bonding layer 320, or a separate glass layer 330 may be further included on a lower surface (or a lower surface of the housing 210) of the electronic device 200.

Referring to FIG. 7, a pressure sensor 100 with a structure that protects an internal dielectric layer 130 by closing the first electrode plate 110 and the second electrode plate 120 based on the waterproof member 140 may be included in the electronic device 200 (or between the digitizer 240 and the heat radiating member 250). In various embodiments, a battery 350 may be disposed in at least a partial area on the first surface 211 (or a lower surface of the housing 210) of the housing 210. The battery 350 may be electrically connected to the elements (e.g., the main printed circuit board 270) in the electronic device 200 to supply electric power for driving of the elements.

Figure 8:
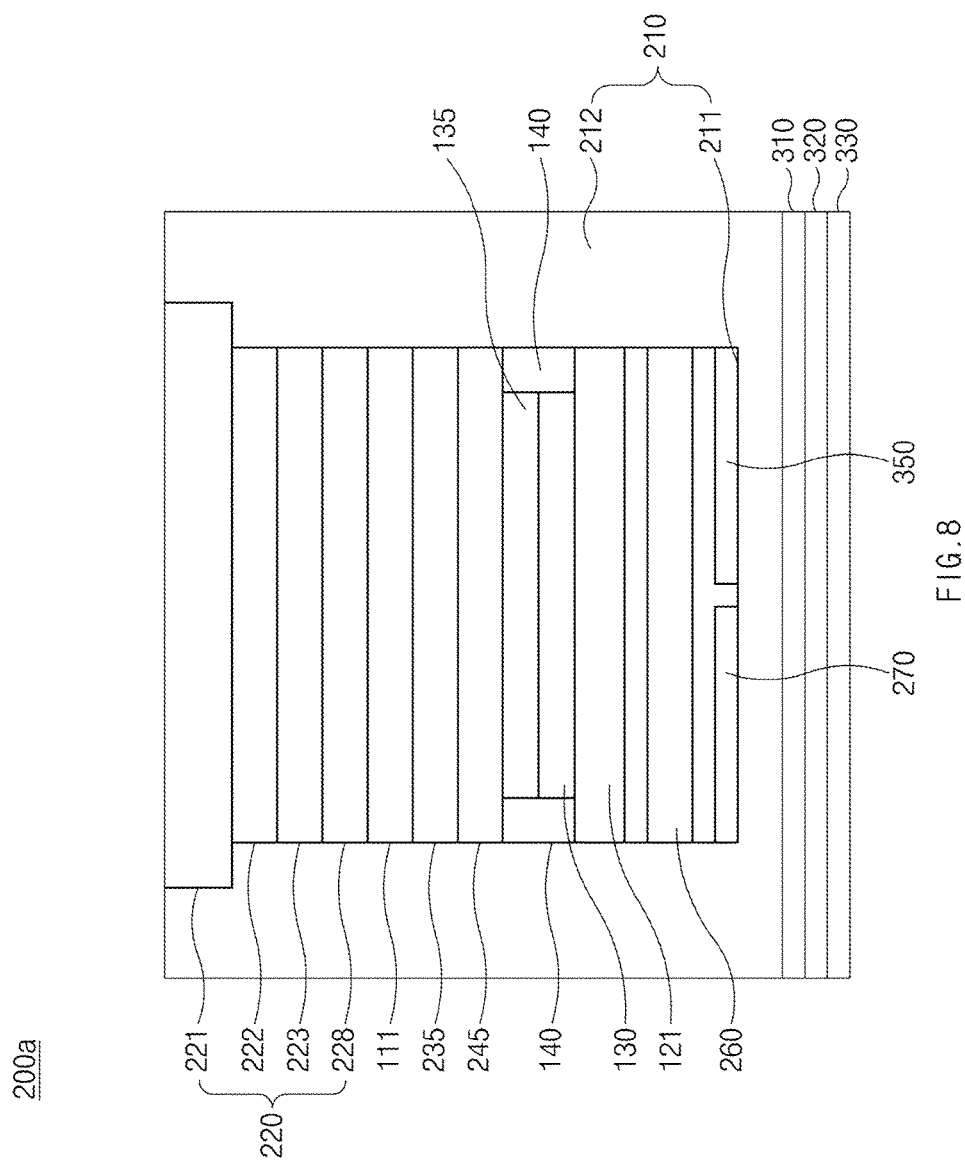
FIG. 8 is a sectional view of an electronic device according to an embodiment of the present disclosure.

FIG. 8 is a sectional view of another electronic device according to an embodiment of the present disclosure.

Referring to FIG. 8, the electronic device 200a may include elements (e.g., the housing 210, the touchscreen display 220, the support member 260, the main printed circuit board 270, or the battery 350) that are the same as or similar to those of the electronic device (200 of FIGS. 5 to 7) described with reference to FIGS. 5 to 7. Referring to FIG. 8, a repeated description of the same or similar elements of FIGS. 5 to 7 may be omitted.

The display panel 228 included in the touchscreen display 220 according to an embodiment, for example, may include an LCD. In this regard, an optical assembly (e.g., a ground member 11, a backlight unit 235, a reflection member 245, or an opaque layer 135) may be disposed in a lower area of the touchscreen display 220.

The ground member 111 according to an embodiment, for example, may perform a grounding or heat radiating function in relation to performance of the function of the touchscreen display 220. To achieve this, the ground member 111 may include a metallic material, a whole part (or at least a portion) of which is conductive. In various embodiments, the ground member 111 may include a first electrode plate (111 of FIGS. 1A to 1C, 2A to 2C, and 3) of the pressure sensor described with reference to FIGS. 1A to 1C, 2A to 2C, 3, and 4. The ground member 111 or the second electrode plate 121, which will be described below, may include a pressure sensor IC (not illustrated) configured to detect a change of the capacitance between the ground member 111 and the second electrode plate 121 or may be electrically connected to the pressure sensor IC.

The backlight unit 235 according to an embodiment may include at least one light source (e.g., a light emitting diode) or a light guide plate (not illustrated) to provide light to the display panel 228. For example, the light irradiated from the at least one light source may be guided by the light guide plate to be provided to the display panel 228.

The reflection member 245 according to an embodiment, for example, may be disposed under the light guide plate to input light leaked to the lower side of the light guide plate to the interior of the light guide plate again. The reflection member 245, for example, may include a sheet or a film having a reflective index of a specific value. The second electrode plate 121 related to the structure of the pressure sensor may be disposed under the reflection member 245 while forming a specific interval from the reflection member 245. The second electrode plate 121, for example, may include a printed circuit board and a conductive pattern formed on an upper surface or a lower surface of the printed circuit board.

According to an embodiment, the dielectric layer 130 and the opaque layer 135 may be disposed in the spacing space between the reflection member 245 and the second electrode plate 121. The opaque layer 135, for example, may include an ink including a reflective material (or on which a reflective material is applied), a film, or a sheet to assist the function of the reflection member 245 located on the opaque layer 135. Further, the opaque layer 135 may protect an element such as the backlight unit 235 by absorbing an external impact delivered from an outer surface (e.g., the outer surface of the first surface 211) of the housing 210.

The waterproof member 140 according to an embodiment may be bonded between the reflection member 245 and the second electrode plate 121 such that the dielectric layer 130 is closed from the outside to prevent introduction of a liquid (e.g., water droplets or foreign substances) to the dielectric layer 130.

In various embodiments, a separate printed circuit layer 210, a separate bonding layer 320, or a separate glass layer 330 may be further included on a lower surface (or a lower surface of the housing 210) of the electronic device 200.

Figure 9:
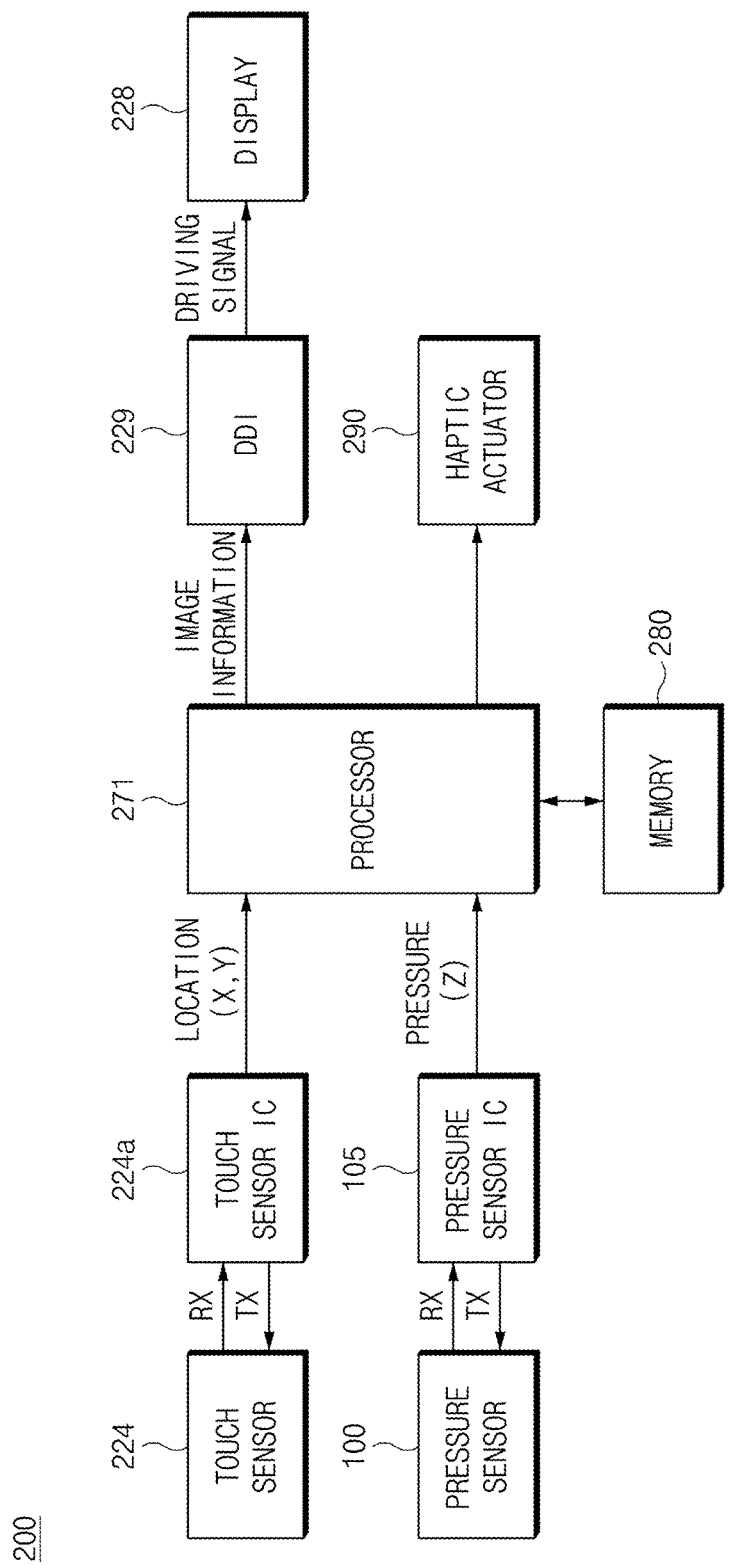
FIG. 9 is a block diagram illustrating a signal processing process of the electronic device according to an embodiment of the present disclosure.

FIG. 9 is a block diagram illustrating a signal processing process of the electronic device according to an embodiment of the present disclosure.

Referring to FIG. 9, in addition to the above-mentioned elements, the electronic device 200 may further include a touch sensor 224, a touch sensor IC 224a, a pressure sensor IC 105, a haptic actuator 290, a memory 280, or a processor 271. At least some of the elements have been described above with reference to FIGS. 1A to 1C, 2A to 2C, and 3 to 8, and a repeated description thereof may be omitted in the following.

According to various embodiments, the display panel 228 may receive an image driving signal received from the display driving circuit 229. The display module 228 may display various content (e.g., a text, an image, a video, an icon, and a symbol) based on the image driving signal. In various embodiments, the display panel 228 may be coupled to the touch sensor 224 (or the touch panel) to overlap the touch sensor 224.

According to various embodiments, the display driving circuit 279 may supply an image driving signal corresponding to image information received from the processor 271 to the display panel 228 at a specific frame rate.

According to various embodiments, in the touch sensor 224, a specific property (e.g., a voltage, a light amount, a resistance, an electric charge, or a capacitance) may be changed by a touch of the user. According to an embodiment, the touch sensor 224 may include the display panel 228.

According to various embodiments, the touch sensor IC 224a may detect a change of a property of the touch sensor 224, and may calculate a location (X, Y) at which a touch is made, based on a change of the property (e.g., a voltage, a resistance, or a capacitance). The calculated location (X, Y) provided to the processor 271. According to various embodiments, when the touch sensor IC 224a is absent, the processor 271 may perform the function of the touch sensor IC 224a.

According to various embodiments, the pressure sensor 100 with a waterproof structure may detect a pressure applied to the touchscreen display 220 by a finger of a user or a touch pen. According an embodiment, in the pressure sensor 110 with a waterproof structure, a property (e.g., a capacitance) between a signal transmission terminal (Tx) (e.g., the first electrode 110 of FIG. 4) and a signal reception terminal (Rx) (e.g., the second electrode 120 of FIG. 4) may be changed by the touch. In an embodiment, the pressure 100 with a waterproof structure may include a waterproof member 140 that interrupts introduction of a liquid into the dielectric layer 130 and assists ventilation and permeation of moisture of the dielectric layer 130.

According to various embodiments, the pressure sensor IC 105 may detect a change of a property (e.g., a capacitance) in the pressure sensor 100 with a waterproof structure, and may calculate a pressure (Z) applied by the user based on a change of the property. The pressure value may be provided to the processor 271 together with the location (X, Y) at which the touch is made. In various embodiments, the pressure sensor IC 105 may be included in the processor 271, or the processor 271 may perform the function of the pressure sensor IC to exclude the pressure sensor IC 105.

According to various embodiments, the haptic actuator 290 may provide a feedback (e.g., vibration) to the user according to a control command of the processor 271. For example, the haptic actuator 290 may provide a haptic feedback to the user when a touch input (e.g. a touch, hovering, or a force touch) from the user.

According to various embodiments, the memory 280 may store commands or data associated with an operation of the elements included in the electronic device 200.

According to various embodiments, the processor 271, for example, may be electrically connected to the elements (e.g., the display driving circuit 229), the touch sensor IC 224a, or the pressure sensor IC 105) included in the electronic device 200 to execute calculations or processing of data on control or communication of the elements included in the electronic device 200. In various embodiments, at least one processor 271 may be included, and may include an AP, a touch sensor IC 224a, or a pressure sensor IC 105. As mentioned above, the processor 271 may perform a function of the touch sensor IC 224a or the pressure sensor IC 105 instead.

In accordance with an aspect of the present disclosure, there is provided an electronic device including a housing including at least one opened surface, a touchscreen display disposed in an interior space of the housing at least a portion of the touchscreen display being exposed through the opened surface of the housing, a pressure sensor disposed between the touchscreen display and the housing the pressure sensor being configured to detect an external pressure applied to the touchscreen display, and at least one processor electrically connected to the pressure sensor, wherein the pressure sensor includes a first electrode plate disposed in parallel to the touchscreen display and having a first size and a first shape, a second electrode plate having a size and a shape that are the same as or similar to the first size and the first shape and facing the first electrode plate, a dielectric layer disposed in a first area between the first electrode plate and the second electrode plate, and a waterproof member disposed in a second area corresponding to a peripheral area of the first area and at least partially enclosing a space between a lower surface of the first electrode plate and an upper surface of the second electrode plate.

According to various embodiments, the waterproof member may be configured to impede introduction of a liquid from an outer surface of the waterproof member towards a center of the dielectric layer.

According to various embodiments, the waterproof member may be configured to ventilate air from an outer surface of the waterproof member towards a center of the dielectric layer and from the center of the dielectric layer towards an outside of the waterproof member.

According to various embodiments, the waterproof member may include a gore-tex membrane.

According to various embodiments, the waterproof member may be disposed such that an outer surface of the waterproof member is vertically aligned with an outer surface of the first electrode plate and an outer surface of the second electrode plate.

According to various embodiments, the waterproof member may be disposed such that an outer surface of the waterproof member at least partially protrudes towards an outside of the first electrode plate and an outer surface of the second electrode plate.

According to various embodiments, the waterproof member may be disposed such that an outer surface of the waterproof member is at least partially recessed towards an inside of the first electrode plate and an outer surface of the second electrode plate.

According to various embodiments, the waterproof member may include at least one hole configured to assist ventilation between an outside of the waterproof member and the dielectric layer.

According to various embodiments, the waterproof member may include an aperture configured such that at least a portion of the dielectric layer is exposed to an external area of the waterproof member, and wherein opposite ends of the waterproof member with respect to the aperture may be spaced apart from each other at a specific interval.

According to various embodiments, the first electrode plate may have a flexibility of a specific value such that a shape of at least a portion of the first electrode plate is deformed according to a pressure applied from an outside of the electronic device.

According to various embodiments, at least a portion of the waterproof member may be deformed according to an external pressure applied to the first electrode plate and wherein the portion of the waterproof member may be resiliently restored when the external pressure is removed.

According to various embodiments, at least one of the first electrode plate or the second electrode plate may include at least one printed circuit board including at least one conductive pattern formed in the printed circuit board.

According to various embodiments, the at least one printed circuit board may at least partially include an FPCB comprising a flexible material.

According to various embodiments, the first electrode plate and the second electrode plate may be constituted to operate using at least one of a self-capacitance method or a mutual capacitance method.

According to various embodiments, at least a portion of at least one of the first electrode plate or the second electrode plate may include a conductive metallic material.

According to various embodiments, the dielectric layer may include at least one of silicon, a polymer, rubber, sponge, urethane, or air.

According to various embodiments, the at least one processor may include an IC configured to detect a change of capacitance between the first electrode plate and the second electrode plate to output an electrical signal.

According to various embodiments, the electronic device may further include a first bonding layer disposed between the first electrode plate and the waterproof member, and a second bonding layer disposed between the second electrode plate and the waterproof member.

In accordance with another aspect of the present disclosure, there is provided an electronic device including a housing including at least one opened surface, a touchscreen display disposed in an interior space of the housing and at least a portion of which is exposed through the opened surface of the housing, a pressure sensor disposed under the touchscreen display of the interior space of the housing and configured to detect an external pressure applied to the touchscreen display, and a processor electrically connected to the pressure sensor, wherein the pressure sensor includes a first electrode plate including a ground member of the touchscreen display and having a first size and a first shape, a second electrode plate having a size and a shape that are the same as or similar to the first size and the first shape and facing the first electrode plate, a dielectric layer disposed in a first area between the first electrode plater and the second electrode plate, and a waterproof member disposed in a second area corresponding to a peripheral area of the first area and at least partially closing a space between a lower surface of the first electrode plate and an upper surface of the second electrode plate.

In accordance with another aspect of the present disclosure, there is provided an electronic device including a housing including a first surface facing a first direction and a second surface facing a second direction that is opposite to the first direction, a touchscreen display disposed between the first surface and the second surface of the housing the touchscreen display being exposed through the first surface, and a pressure sensor disposed between the touchscreen display and the second surface of the housing the pressure sensor being configured to detect a pressure of an external object to the touchscreen display, wherein the pressure sensor includes a first electrode disposed substantially parallel to the touchscreen display, a second electrode spaced apart from the first electrode in the second direction and disposed substantially parallel to the first electrode, a dielectric layer disposed between the first electrode and the second electrode, and a waterproof member surrounding at least a portion of an edge of the dielectric layer and disposed to impede introduction of moisture into the dielectric layer.

According to various embodiments, the waterproof member may at least partially include a material that is different from a material of the dielectric layer.

According to various embodiments, a change of dielectric characteristics of the dielectric layer and deterioration of the performance of the pressure sensor may be prevented by disposing the waterproof member that closes the dielectric layer such that introduction of a liquid (e.g., water droplets) into the dielectric layer in the pressure sensor structure may be interrupted.

Further, according to various embodiments, a spatial design of the electronic device employing the pressure sensor may be easily made by disposing the waterproof member in an internal area of the pressure sensor structure and excluding an increase of the volume of the pressure sensor.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a housing including at least one opened surface;
a touchscreen display disposed in an interior space of the housing, at least a portion of the touchscreen display being exposed through the opened surface of the housing;
a pressure sensor disposed between the touchscreen display and the housing, the pressure sensor being configured to detect an external pressure applied to the touchscreen display; and
at least one processor electrically connected to the pressure sensor,
wherein the pressure sensor includes:
a first electrode plate disposed in parallel to the touchscreen display and having a first size and a first shape;
a second electrode plate having a size and a shape that are the same as or similar to the first size and the first shape and facing the first electrode plate;
a dielectric layer disposed in a first area between the first electrode plate and the second electrode plate; and
a waterproof member disposed in a second area corresponding to a peripheral area of the first area and at least partially enclosing a space between a lower surface of the first electrode plate and an upper surface of the second electrode plate.

2. The electronic device of claim 1, wherein the waterproof member is configured to impede introduction of a liquid from an outer surface of the waterproof member towards a center of the dielectric layer.

3. The electronic device of claim 1, wherein the waterproof member is configured to ventilate air from an outer surface of the waterproof member towards a center of the dielectric layer and from the center of the dielectric layer towards an outside of the waterproof member.

4. The electronic device of claim 1, wherein the waterproof member includes a gore-tex membrane.

5. The electronic device of claim 1, wherein the waterproof member is disposed such that an outer surface of the waterproof member is vertically aligned with an outer surface of the first electrode plate and an outer surface of the second electrode plate.

6. The electronic device of claim 1, wherein the waterproof member is disposed such that an outer surface of the waterproof member at least partially protrudes towards an outside of the first electrode plate and an outer surface of the second electrode plate.

7. The electronic device of claim 1, wherein the waterproof member is disposed such that an outer surface of the waterproof member is at least partially recessed towards an inside of the first electrode plate and an outer surface of the second electrode plate.

8. The electronic device of claim 1, wherein the waterproof member includes at least one hole configured to assist ventilation between an outside of the waterproof member and the dielectric layer.

9. The electronic device of claim 1,
wherein the waterproof member includes an aperture configured such that at least a portion of the dielectric layer is exposed to an external area of the waterproof member, and
wherein opposite ends of the waterproof member with respect to the aperture are spaced apart from each other at a specific interval.

10. The electronic device of claim 1, wherein the first electrode plate has a flexibility of a specific value such that a shape of at least a portion of the first electrode plate is deformed according to a pressure applied from an outside of the electronic device.

11. The electronic device of claim 10,
wherein at least a portion of the waterproof member is deformed according to an external pressure applied to the first electrode plate, and
wherein the portion of the waterproof member is resiliently restored when the external pressure is removed.

12. The electronic device of claim 1, wherein at least one of the first electrode plate or the second electrode plate includes:
at least one printed circuit board including at least one conductive pattern formed in the printed circuit board.

13. The electronic device of claim 12, wherein the at least one printed circuit board at least partially includes a flexible printed circuit board (FPCB) comprising a flexible material.

14. The electronic device of claim 12, wherein the first electrode plate and the second electrode plate are configured to operate using at least one of a self-capacitance method or a mutual capacitance method.

15. The electronic device of claim 1, wherein at least a portion of at least one of the first electrode plate or the second electrode plate includes a conductive metallic material.

16. The electronic device of claim 1, wherein the dielectric layer includes at least one of silicon, a polymer, rubber, sponge, urethane, or air.

17. The electronic device of claim 1, wherein the at least one processor includes an integrated circuit (IC) configured to detect a change of capacitance between the first electrode plate and the second electrode plate to output an electrical signal.

18. The electronic device of claim 1, further comprising:
a first bonding layer disposed between the first electrode plate and the waterproof member; and
a second bonding layer disposed between the second electrode plate and the waterproof member.

19. An electronic device comprising:
a housing including a first surface facing a first direction and a second surface facing a second direction that is opposite to the first direction;
a touchscreen display disposed between the first surface and the second surface of the housing, the touchscreen display being exposed through the first surface; and
a pressure sensor disposed between the touchscreen display and the second surface of the housing, the pressure sensor being configured to detect a pressure of an external object to the touchscreen display,
wherein the pressure sensor includes:
a first electrode disposed substantially parallel to the touchscreen display;
a second electrode spaced apart from the first electrode in the second direction and disposed substantially parallel to the first electrode;
a dielectric layer disposed between the first electrode and the second electrode; and a waterproof member surrounding at least a portion of an edge of the dielectric layer and disposed to impede introduction of moisture into the dielectric layer.

20. The electronic device of claim 19, wherein the waterproof member at least partially includes a material that is different from a material of the dielectric layer.

\* \* \* \* \*